Figure 1:
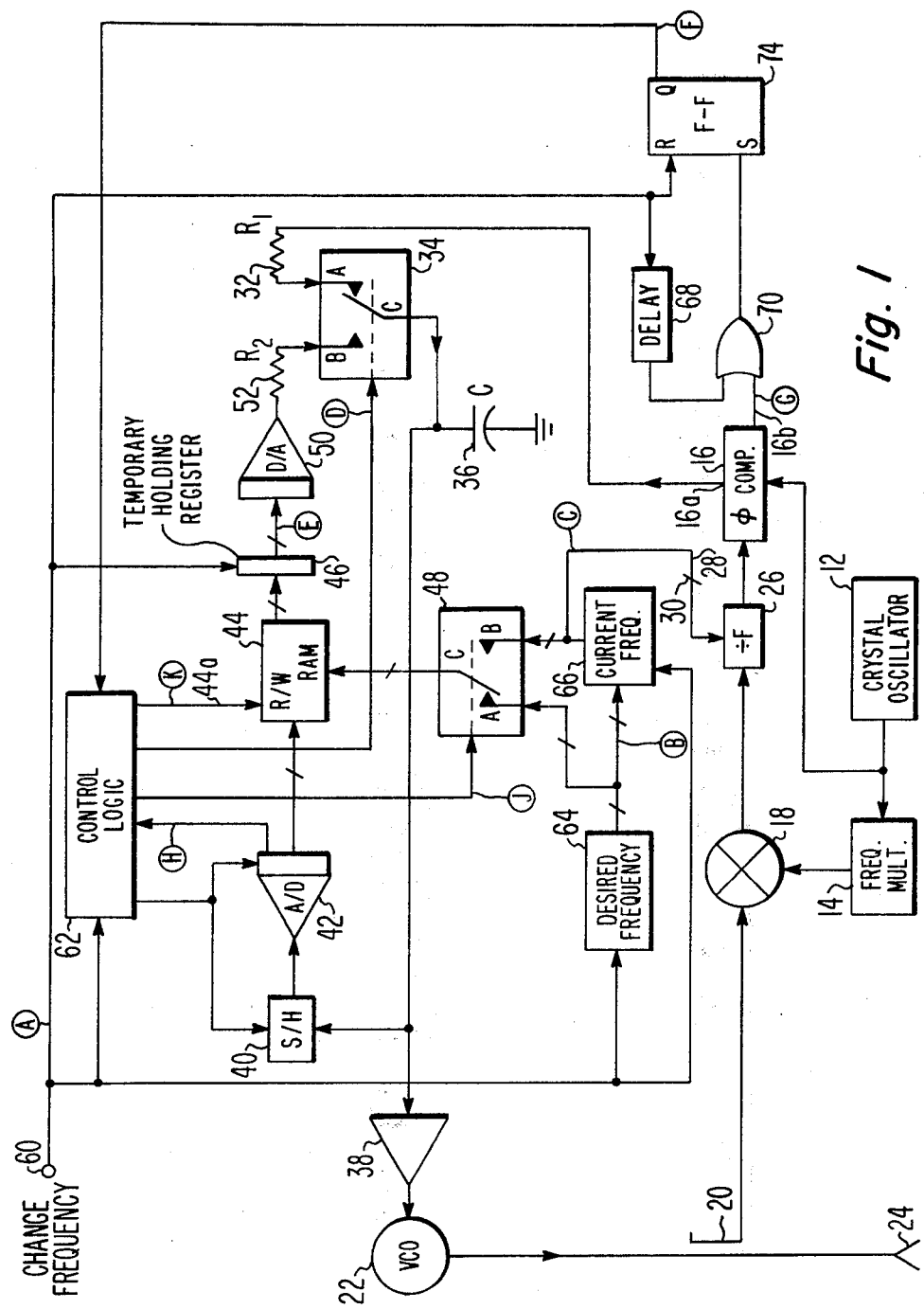

United States Patent [19]

Kipp et al.

[11] 4,410,860

[45] Oct. 18, 1983

[54] FREQUENCY SYNTHESIZER WITH LEARNING CIRCUIT

[75] Inventors: Ronald W. Kipp, Croydon, Pa.; Henry C. Johnson, Neshanic, N.J.

[73] Assignee: RCA Corporation, New York, N.Y.

[21] Appl. No.: 221,576

[22] Filed: Dec. 31, 1980

[51] Int. Cl.³ .............................................. H03L 7/18
[52] U.S. Cl. .................... 331/1 A; 331/17; 331/25
[58] Field of Search ............ 331/1 A, 1 R, 17, 25, 331/111, 143

[56] References Cited

U.S. PATENT DOCUMENTS

| | | | |
|---|---|---|---|
| 3,675,146 | 7/1972 | Langham | 331/1 A X |
| 3,753,142 | 8/1973 | Nardin et al. | 331/1 A |
| 3,927,384 | 12/1975 | Jezo | 331/17 X |
| 4,272,729 | 6/1981 | Riley | 331/1 A |

Primary Examiner—Siegfried H. Grimm
Attorney, Agent, or Firm—J. S. Tripoli; R. L. Troike; R. E. Smiley

[57] ABSTRACT

A frequency synthesizer of the phase-locked loop type, having an output circuit circuit which produces an output signal at any of a plurality of alternating frequency values depending on the value of a command signal applied to the output circuit. The synthesizer includes a storage apparatus for storing, for each frequency value, an indication of the precise command signal value which causes the frequency to be produced. When the frequency is again to be produced the stored signal is used to rapidly drive the output circuit to produce the desired frequency

10 Claims, 2 Drawing Figures

FREQUENCY SYNTHESIZER WITH LEARNING CIRCUIT

The Government has rights in this invention pursuant to Contract No. DAAK20-80-C-0020 awarded by the Department of the Army.

This invention is concerned with frequency synthesizers, and more particularly, with frequency synthesizers of the type which are preset by a predetermined signal to produce approximately the desired frequency.

Microwave frequency synthesizers for accurate generation of desired output frequencies are in wide use in the commercial and military communications and radar fields. Each of two basic methods for affecting frequency signal synthesis use one or more crystal-controlled oscillators as the basic reference frequencies, and each is digitally programmable in small frequency increments. A first direct method uses algebraic manipulation of the one or more reference frequencies to produce the output frequency. This method results in a frequency synthesizer having limited bandwidth, using complex filtering, and being relatively expensive. A second indirect method, which uses a programmable phase-locked loop for controlling and maintaining a desired output frequency from a voltage controlled oscillator (VCO), is relatively low in cost, covers a wide bandwidth, but is relatively slow to respond to a command to change the output frequency of the synthesizer to a desired different frequency value. This limitation of frequency synthesizers that include a phase-locked loop makes them undesirable for use in applications where a very rapid change from one output frequency to another desired output frequency is required.

To overcome the speed limitation problem it is known to provide a frequency synthesizer of the phase-locked loop type including means for applying an initial predetermined frequency-control voltage to the VCO. See U.S. Pat. No. 4,105,948, issued Aug. 8, 1978 to H. J. Wolkstein. The predetermined control voltage is by necessity only an approximation of that voltage which causes the VCO to produce precisely the desired frequency. Thus time is still consumed by the frequency synthesizer in changing from the approximate frequency due to the predetermined voltage to the precise desired frequency.

Therefore, in accordance with a preferred embodiment of the present invention, a frequency synthesizer of the phase-locked loop type includes a storage means for storing for each desired frequency that the system can produce a signal value which causes the output frequency producing means to produce exactly the desired frequency.

Figure 2:
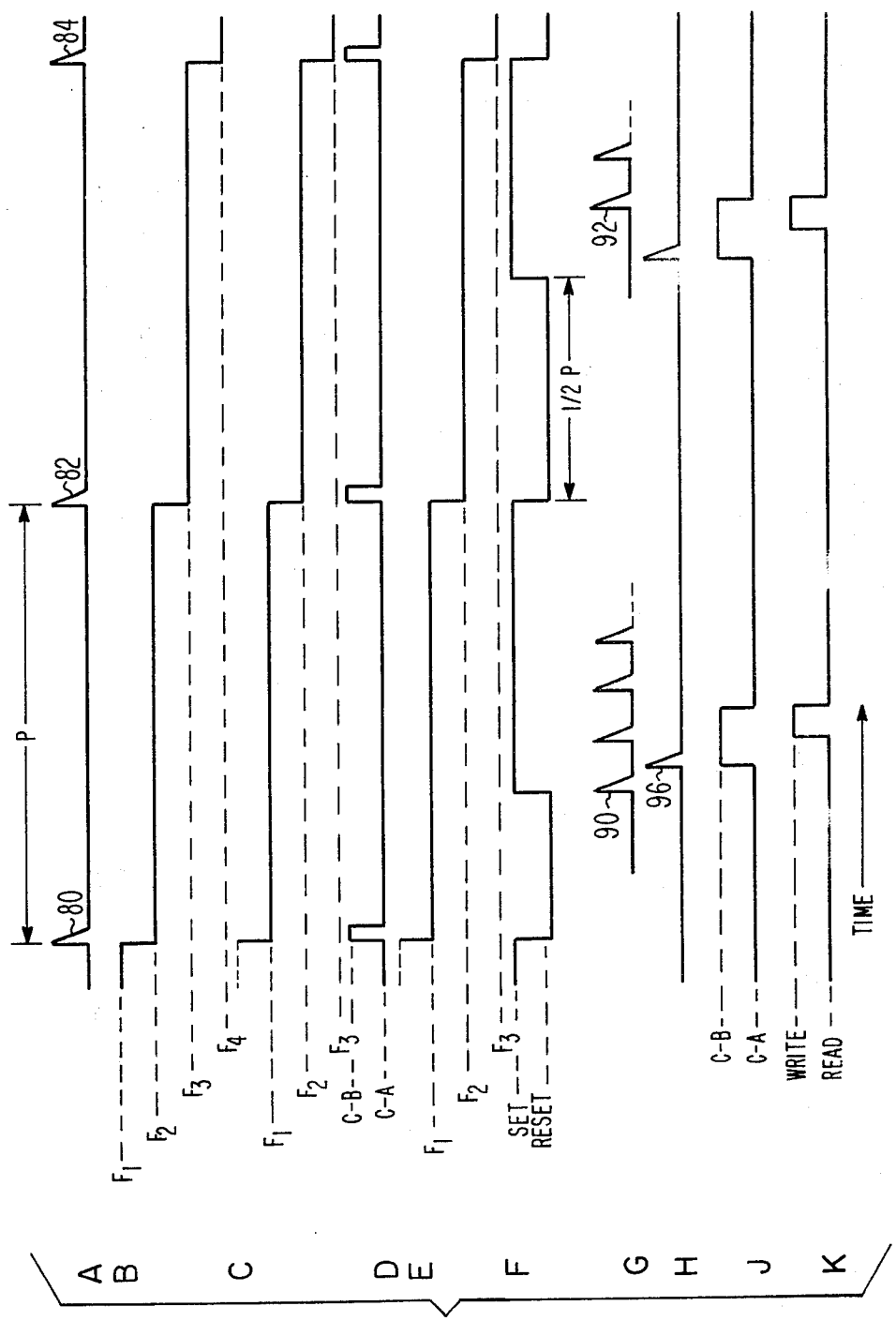

In the drawing:

FIG. 1 is a block diagram of a frequency synthesizer constructed according to the teachings of the invention; and FIG. 2 is a set of waveforms of various elements in the synthesizer of FIG. 1 and useful in understanding its operation.

In FIG. 1, a stable frequency source such as a crystal oscillator 12 is coupled to a frequency multiplier circuit 14 and to a phase comparator circuit 16, each of conventional design. The frequency multiplier 14 is coupled to a subtractive mixer 18. Mixer 18 also receives an input signal from a coupler 20 which is coupled thereto. Coupler 20 is coupled to receive an alternating frequency signal from a voltage controlled oscillator (VCO) 22 or other adjustable frequency source. VCO 22 is also coupled to a radiating antenna 24 to transmit into the atmosphere the alternating signal produced by VCO 22. Mixer 18 is coupled to a frequency divider circuit 26. Divider circuit 26 receives digitally-generated signals on a multi-conductor cable 28 (All multi-conductor cables are designated by a cross hatch symbol such as 30) which are indicative of the frequency of signal desired to be produced by VCO 22. Divider circuit 26 is coupled to a second input of phase comparator 16. Comparator 16 is coupled via resistor 32 (also designated $R_1$) and pole A and arm C of switch 34 to a capacitor 36 (also designated C) and to an amplifier 38. Amplifier 38, which may or may not have gain and may or may not provide direct current offset depending on the parameters of the system components, is coupled to the control terminal of VCO 22 to control the frequency of signals produced thereby. Resistor 32 and capacitor 36 together form an RC time constant circuit.

All components thus far described (except for switch 34) and their interconnection are those found in a standard frequency synthesizer of the phase-locked loop type, the operation of which is well known to those skilled in the art. A brief description of the operation of the circuit components thus far described, along with exemplary frequency values and with the assumption that arm C is connected to pole A of switch 34 as illustrated in FIG. 1, is as follows.

Assume by way of example that VCO 22 is expected to produce a frequency in the range from 10,005 to 10,500 MHz in increments of 5 MHz. Then, typically, crystal oscillator 12 produces a signal of the incremental frequency, i.e., 5 MHz. Frequency multiplier 14 multiplies the crystal oscillator frequency to produce a frequency value which is near but outside the range of frequencies produced by VCO 22. With an examplary multiplication factor of 2,000, the resulting frequency multiplied signal of 10,000 MHz is subtractively mixed in mixer 18 with the signal produced by VCO 22 having a value between the range of 10,005 MHz to 10,500 MHz. The resultant signal produced by mixer 18 having a value in the range of 5 to 500 MHz is divided by divider 26 by a value corresponding to the desired frequency output of VCO 22 as indicated by signals applied on line 28 to circuit 26. The output of circuit 26 is such that when the VCO is producing a desired frequency, circuit 26 produces a 5 MHz signal equal to that produced by oscillator 12. Thus, for example, if VCO 22 is to produce 10,500 MHz, circuit 26 divides by 100. Similarly, if VCO 22 is to produce 10,005 MHz, circuit 26 divides by 1, again to ideally produce an output of 5 MHz.

When the frequency of the signal produced by oscillator 12 and that produced by circuit 26 as a result of the frequency of VCO 22 are equal and in phase, phase comparator 16 produces on line 16a thereof typically either no signal or a signal alternating between a high value and a low value at a 50 percent duty cycle. When VCO 22 is producing a signal of too high a frequency and therefore circuit 26 is producing a signal of frequency greater than 5 MHz, phase comparator 16 produces on line 16a a relatively negative signal or a signal in which the low value portion of the alternating high and low signal is emphasized over the high value portion, assuming that VCO 22 has a positive transfer function (i.e., an increase of control voltage produces an increase of output frequency). Conversely, when VCO 22 is producing a signal which is too low in frequency and therefore circuit 26 is producing a signal of frequency less than 5 MHz, phase comparator 16 produces on line 16a a relatively positive signal or a signal in which the high value portion of the alternating high and low signal is emphasized over the low value portion.

The signal produced on line 16a charges or discharges capacitor 36 according to the rate determined by the time constant value of C and $R_1$. A relatively large time constant of $R_1$ and C results in a relatively long time for VCO 22 to stabilize at a new frequency, but the VCO output will become very stable. In contrast, a relatively small time constant of $R_1$ and C results in a relatively short time for VCO 22 to lock at a new frequency, but the VCO output is rather unstable, tending to hunt about the desired frequency.

In accordance with the invention and continuing to refer to FIG. 1, arm C of switch 34 is coupled to a sample-and-hold circuit (S/H) 40. S/H 40 is coupled to an analog-to-digital circuit (A/D) 42 which is coupled to a random access memory (RAM) 44 to provide information thereto. RAM 44 is coupled to a temporary holding register 46 and to the common (C) arm of a single-pole-double throw switch 48. It will be understood that switch 48, like switch 34, is in reality, a solid state device but is shown as a mechanical switch for schematic simplification. Temporary holding register 46 is coupled to a digital-to-analog converter (D/A) 50 for the conversion of digital information stored in temporary holding register 46 to an analog voltage level. D/A 50 is coupled via resistor 52 (also designated $R_2$), to terminal B of single-pole double-throw switch 34.

The value of resistor 52 is much less than the value of resistor 32. In fact, resistor 52 may be just the resistance of the interconnection between D/A 50 and capacitor 36 added to the resistance of the output circuit of D/A 50.

Referring to the upper left corner of FIG. 1, terminal 60 receives a "change frequency" pulse from a source (not shown) whenever it is desired to change the frequency produced by VCO 22. Terminal 60 is coupled to the control terminal of each of a control logic means 62, a source of signal indicative of desired frequencies 64, a temporary storage means 66 for storing the current frequency, via a delay 68 to one terminal of an OR gate 70, to the reset (R) terminal of a J-K flip-flop 74 and to temporary holding register 46.

Comparator 16 produces a signal on line 16b when it is locked, that is, when the signal produced by oscillator 12 and circuit 26 are of the same frequency and phase. Line 16b is connected to OR gate 70. OR gate 70 is coupled to the set (S) terminal of flip-flop 74. The Q terminal of flip-flop 74 is coupled to control logic block 62.

Control logic block 62 is basically a timing means which is responsive to input signals from terminal 60, flip-flop 74 and A/D 42 to produce at pre-selected times thereafter, signals which are applied to control terminals of S/H 40, A/D 42, switches 34 and 48 and to the read/write (R/W) terminal of RAM 44. The timing of signals applied to control logic block 62 and produced by control logic block 62 is as indicated in FIG. 2, which will be referred to in connection with a description of the operation of the system of FIG. 1. Control logic block 62 may consist of a series of pre-selected delays or a master clock source and counters reset by th various inputs and designed to produce outputs at pre-selected counts.

Desired frequency block 64 is any suitable source of digital indication of frequency to be produced by VCO 22, such as, for example, a computer or preset switches. Each time desired frequency block 64 receives a change frequency pulse from terminal 60 it changes to the next frequency which may be the same as or different from the preceding frequency. Block 64 is coupled to the A pole of switch 48 and to the input terminal of temporary storage means 66 for storing the previous frequency indication produced by block 64 and which, as will be described is the current frequency being produced by VCO 22. For example, if block 64 is producing an indication of a frequency $F_1$ and a change frequency pulse occurs, the indication of frequency $F_1$ will be stored in temporary storage means 66 while an indication of a new frequency $F_2$ will be stored in block 64, both under control of the change frequency pulse.

Operation of the frequency sythesizer of FIG. 1 will be described with reference as desired to the waveforms of FIG. 2. The encircled letters at various points in FIG. 1 correspond to similar letters in the waveforms of FIG. 2. Thus, waveform A, FIG. 2 (hereinafter waveform 2A) is produced at terminal 60, FIG. 1, and consists of a series of pulses at a period P which, for example, may be, 50 microseconds. It will be initially assumed that desired frequency block 64 is producing a signal indicative of a frequency $F_1$ which is the frequency which VCO 22 is to produce after waveform 2A, pulse 80, is generated. Further, it is assumed that switches 32 and 48 are positioned as shown, that is, with common arm C connected to pole A and that for each frequency that VCO 22 can assume an associated RAM 44 storage location stores a digital number which when converted to an analog value is of such a value as to cause VCO 22 to produce approximagtely or exactly the desired frequency.

When pulse 80, waveform 2A, occurs, it causes an indication of frequency $F_1$ to be stored in temporary storage 66 from block 64, causes the digital value stored in RAM 44 at the address determined by the digital value corresponding to $F_1$ as stored in block 64, to be transmitted to holding register 46, where the value stored in RAM 44 is the digital equivalent of a voltage which will cause VCO 22 to produce frequency $F_1$, and causes the next desired frequency $F_2$ to be produced in block 64. The value in block 64 causes RAM 44 to be addressed to produce the digital value, the analog equivalent of which will cause VCO to produce frequency $F_2$. However, by the time this occurs, the digital equivalent of $F_1$ is stored in temporary holding register 46 where it remains until the next change frequency pulse 82, waveform 2A, occurs. Further, pulse 80 resets flip-flop 74 and starts timing activities in control logic 62.

Immediately upon receipt of pulse 80, control logic 62 produces a pulse, waveform 2D, which causes switch 34, arm C, to contact pole B at which time D/A 50 is producing an analog voltage which will cause VCO 22 to produce frequency $F_1$. Because resistor 52 is very small and therefore the $R_2C$ time constant is very small, following pulse 80, waveform 2A, VCO 22 quickly produces a frequency near and perhaps equal to frequency $F_1$. As known to those skilled in the art, the voltage applied to VCO 22 will be within 99 percent of the voltage produced by D/A 50 within 5 $R_2C$ time constants. Then under control of control logic 62, switch 34 is reset to the position illustrated in FIG. 1; that is, with arm C in contact with pole A, and the normal phase-locked loop operation previously discussed resumes with VCO 22 attaining and maintaining frequency $F_1$.

When phase comparator 16 determines that VCO 22 is producing frequency $F_1$, a pulse indicative of that fact is produced on line 16b and causes flip-flop 74 to set. See waveform 2G, pulse 90. Pulses such as 90 indicate comparator 16 is locked.

At all times S/H 40 is monitoring the voltage supplied to amplifier 38, which is therefore essentially the voltage supplied to VCO 22. As a result of flip-flop 74 becoming set, control logic 62 causes S/H 40 to hold the voltage it is sampling and causes A/D 42 to digitize that voltage. When A/D 42 is producing a stable output an indication pulse is sent to control logic 62 (see waveform 2H, pulse 96). Upon receipt of pulse 96, control logic 62 causes switch 48 to change state such that arm C is in contact with pole B. Thus, RAM 44 is addressed at its location which corresponds to the current frequency $F_1$ set in temporary store 66. When RAM 44 is stable the value stored in S/H 40 is stored in RAM 44 under control of a write signal applied on line 44a to RAM 44. See waveform 2K.

Thereafter switch 48 is reset to the position illustrated in FIG. 1, that is, with arm C in contact with pole A and RAM 44 is again addressed in the read mode to produce a value equal to $F_2$.

Thus, in summary, following the procedure just described, RAM 44 contains at a storage location corresponding to frequency $F_1$ a digital value equal to the precise voltage which causes VCO 22 to produce $F_1$. In the absence of any parameter shifts the next time frequency $F_1$ is called for, RAM 44 will be storing a value which will cause VC0 22 to produce exactly frequency $F_1$ from the beginning. However, the phase of the signals supplied to comparator 16 must still be made to coincide.

In the event that the system is not locked on frequency and in phase after some point in time following a change frequency pulse and therefore comparator 16 is not producing a lock on signal on line 16b, the change frequency pulse via delay 68 will set flip-flop 74 and the above-described procedure will repeat. Such action, which is illustrated in FIG. 2 between pulses 82 and 84 of waveform A, is likely to occur when the synthesizer is first activated before RAM 44 contains proper data. The amount of delay in delay 68 may be set to any desired value such that there is ample time to write data into RAM 44 and to have it set to the readout value of the next frequency before the next change frequency pulse, such as pulse 84, waveform 2A, occurs. As illustrated in the waveforms of FIG. 2, in the cycle following the change frequency pulse 82, because a delay equal to one half P is chosen, flip-flop 74 is set (waveform 2F) after a time equal to one half P following waveform 2A, pulse 82, even though the first lock up indication of comparator 16 occurs later. See pulse 92, waveform 2G. In this case, RAM 44 does not contain the exact indication of the associated frequency but contains a value which approximates the desired frequency more closely than would be true in the absence of the invention. Typically, upon initial start up of the synthesizer, a learning process occurs in that several iterations of each frequency must occur before RAM 44 contains the correct value for each of the desired frequencies.

What is claimed is:

1. A frequency synthesizer, comprising:

a phase locked loop including a voltage controlled oscillator (VCO) having a control voltage terminal, a phase comparator, a frequency divider having a control input terminal and coupled at a signal input terminal to an output of said VCO and coupled at a signal output terminal to an input of said phase comparator, a source of a reference oscillation coupled to the other input of said phase comparator, means providing a first path for a first control voltage signal from the output of said phase comparator to the control voltage terminal of said VCO, and a source of an output frequency command signal coupled to said control input terminal of said frequency divider for providing as a function of time signals indicative of various frequencies to be produced by said VCO including, from time to time, a signal indicative of a given frequency;

said phase comparator including means producing a control signal different than said first control voltage signal when the input signals supplied thereto are in phase;

means responsive to the occurrence of said first control voltage signal when said given frequency is being produced by said VCO for storing a signal indicative of the value of said first control voltage signal;

means providing a second path between said storing means and said control voltage terminal of said VCO for providing from said storing means to said terminal of said VCO a second control voltage signal thereto; and means responsive to a change of said output frequency command signal to provide a signal indicative of said given frequency following a signal indicative of some other frequency to interrupt said first path and momentarily connect said second path to pass to said VCO terminal said second control voltage signal having the value of said first control voltage signal when said given frequency was previously produced to cause said VCO to again produce said given frequency.

2. The combination as set forth in claim 1 wherein said means for storing a signal comprises an addressable random access memory (RAM).

3. The combination as set forth in claim 2 wherein said source of output frequency command signals is coupled to address said RAM in response to the occurrence of said control signal for causing said RAM to store therein said signal indicative of the value of said first control voltage.

4. The combination as set forth in claim 3 wherein said means for storing a signal further comprises means coupled to receive and temporarily store said first control voltage signal and means responsive to the stored control voltage signal for producing a digital signal representative thereof to be stored in said RAM.

5. The combination as set forth in claim 4 wherein said means providing said second path comprises means for converting said digital signal stored in said RAM to said second control voltage signal.

6. The combination as set forth in claim 1 wherein said means providing said first path includes a first filter comprising a first resistor and a capacitor together having a first relatively lower time constant value and wherein said means providing said second path includes a second filter comprising a second resistor and said capacitor together having a second different relatively higher time constant value and wherein when said second path is connected, said capacitor is charged to said second control voltage which causes said VCO to produce said given frequency.

7. The combination as set forth in claim 2 wherein said means providing said first path includes a first filter comprising a first resistor and a capacitor having a first relatively lower time constant value and wherein said means providing said second path includes a second filter comprising a second resistor and said capacitor and having a second different relatively higher time constant value and wherein when said second path is connected, said capacitor is charged to said second control voltage which causes said VCO to produce said given frequency.

8. The combination as set forth in claim 3 wherein said means providing said first path includes a first filter comprising a first resistor and a capacitor having a first relatively lower time constant value and wherein said means providing said second path includes a second filter comprising a second resistor and said capacitor and having a second different relatively higher time constant value and wherein when said second path is connected, said capacitor is charged to said second control voltage which causes said VCO to produce said given frequency.

9. The combination as set forth in claim 4 wherein said means providing said first path includes a first filter comprising a first resistor and a capacitor having a first relatively lower time constant value and wherein said means providing said second path includes a second filter comprising a second resistor and said capacitor and having a second different relatively higher time constant value and wherein when said second path is connected, said capacitor is charged to said second control voltage which causes said VCO to produce said given frequency.

10. The combination as set forth in claim 5 wherein said means providing said first path includes a first filter comprising a first resistor and a capacitor having a first relatively lower time constant value and wherein said means providing said second path includes a second filter comprising a second resistor and said capacitor and having a second different relatively higher time constant value and wherein when said second path is connected, said capacitor is charged to said second control voltage which causes said VCO to produce said given frequency.

* * * * *